(12) United States Patent
Cai

(10) Patent No.: US 9,881,893 B2
(45) Date of Patent: Jan. 30, 2018

(54) APPARATUS FOR REMOVING CHIP

(71) Applicants: BOE Technology Group Co., Ltd., Beijing (CN); Hefei BOE Optoelectronics Technology Co., Ltd., Anhui (CN)

(72) Inventor: Guangyuan Cai, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/251,299

(22) Filed: Aug. 30, 2016

(65) Prior Publication Data
US 2017/0110433 A1    Apr. 20, 2017

(30) Foreign Application Priority Data
Oct. 16, 2015   (CN) .......................... 2015 1 0671659

(51) Int. Cl.
| B32B 38/10 | (2006.01) |
| H01L 23/00 | (2006.01) |
| B32B 43/00 | (2006.01) |
| B32B 37/00 | (2006.01) |

(52) U.S. Cl.
CPC ........ H01L 24/799 (2013.01); B32B 37/0053 (2013.01); B32B 43/006 (2013.01);
(Continued)

(58) Field of Classification Search
CPC . B32B 38/10; B32B 43/006; Y10T 156/1132; Y10T 156/1153; Y10T 156/1911; Y10T 156/1944

USPC .......................... 156/707, 711, 752, 758, 924
See application file for complete search history.

(56) References Cited

U.S. PATENT DOCUMENTS 6,685,080 B1 * 2/2004 Kee .......................... B23K 1/018
                                                                               228/102
8,349,116 B1 * 1/2013 Bibl .......................... H01L 24/83
                                                                               156/249

(Continued)

FOREIGN PATENT DOCUMENTS

| CN | 101144924 A | 3/2008 |
| CN | 104159441 A | 11/2014 |

OTHER PUBLICATIONS

First Office Action from Chinese Patent Application No. 201510671659.4, dated Jul. 27, 2017, 6 pages.
(Continued)

*Primary Examiner* — Mark A Osele
*Assistant Examiner* — Nickolas Harm
(74) *Attorney, Agent, or Firm* — Westman, Champlin & Koehler, P.A.

(57) ABSTRACT

The present disclosure provides an apparatus for removing a chip, including: a loading station; a heating head arranged to soften an anisotropic conductive film on a substrate of a display panel for fixing the chip; a base table arranged on the loading station and arranged to support the display panel; and a base seat arranged on the loading station and arranged to support the heating head, wherein the heating head is rotatably mounted onto the base seat and the heating head has a rotation axis perpendicular to a surface of the loading station facing towards the base table. With the above apparatus, the face of the heating head facing towards the chip contacts with the face of the chip facing towards the heating head more sufficiently. The force to which the portion of the chip is subject is reduced and the force applied to the chip becomes more uniform.

10 Claims, 2 Drawing Sheets

(52) U.S. Cl.
CPC ........... *B32B 38/10* (2013.01); *B32B 2457/20* (2013.01); *H01L 2224/29099* (2013.01); *H01L 2224/75252* (2013.01); *H01L 2224/75744* (2013.01); *H01L 2224/75804* (2013.01); *H01L 2224/75822* (2013.01); *H01L 2224/7999* (2013.01); *H01L 2924/0781* (2013.01); *Y10T 156/1132* (2015.01); *Y10T 156/1153* (2015.01); *Y10T 156/1911* (2015.01); *Y10T 156/1944* (2015.01)

(56) References Cited

U.S. PATENT DOCUMENTS

| | | | | |
|---|---|---|---|---|
| 2008/0283198 | A1* | 11/2008 | Papworth | H01L 21/67132 156/752 |
| 2008/0305434 | A1* | 12/2008 | Nishi | G03F 7/26 430/296 |
| 2011/0216539 | A1* | 9/2011 | Yuan | F21V 21/06 362/249.1 |
| 2015/0072078 | A1* | 3/2015 | Negoro | H01L 21/67028 427/346 |
| 2016/0074979 | A1* | 3/2016 | Wang | B25B 27/00 29/762 |

OTHER PUBLICATIONS

Second Office Action for Chinese Patent Application No. 201510671659.4, dated Nov. 13, 2017, 5 pages.

\* cited by examiner

APPARATUS FOR REMOVING CHIP

CROSS-REFERENCE TO RELATED APPLICATION

This application claims benefit of Chinese Application No. 201510671659.4, filed with the State Intellectual Property Office of China on Oct. 16, 2015 and entitled with "APPARATUS FOR REMOVING CHIP", which is incorporated herein by reference in its entirety.

BACKGROUND OF THE DISCLOSURE

Field of the Disclosure

The present disclosure generally relates to the field of technology for producing a display panel, in particular, to an apparatus for removing a chip.

Description of the Related Art

During manufacturing a display panel, it is desired to adhere a drive chip, for example a drive integrated circuit on the display panel by an anisotropic conductive film (ACF) so as to achieve display function of the display panel. However, in practical production, the adhesion of the chip may be poor, for example, misalignment or breakage occurs. In this circumstance, the chip needs to be removed for rework.

In the conventional means for removing the chip, the display panel is placed on a loading station. The loading station is fixed with respect to a base seat. A heating head is also fixed with respect to the loading station. The display panel is moved by hand to approach the heating head. By means of heating the chip through the heating head, the anisotropic conductive film is heated to soften at a corresponding location. Then the display panel is moved continuously by hand to remove the chip.

However, in the prior art, the heating head is fixed. When the display panel is moved by hand, a face of the chip on the display panel facing towards the heating head may not parallel to a face of the heating head facing towards the chip. It may cause a certain corner of the chip to contact with the heating head such that the chip is subject to non-uniform force. Thus, the chip tends to crack to scratch electrodes of the display panel.

SUMMARY

In view of this, the present disclosure provides an apparatus for removing a chip, which may enhance the uniformity of the force to which the chip is subject and reduce the chance that the chip cracks to scratch electrodes of the display panel.

For the above object, the present disclosure provides the following solutions.

The present disclosure provides an apparatus for removing a chip, including: a loading station; a heating head arranged to soften an anisotropic conductive film on a substrate of a display panel for fixing the chip; a base table arranged on the loading station and arranged to support the display panel; and a base seat arranged on the loading station and arranged to support the heating head, wherein the heating head is rotatably mounted onto the base seat and the heating head has a rotation axis perpendicular to a surface of the loading station facing towards the base table.

With the apparatus for removing the chip provided by the present disclosure, in use, the substrate of the display panel is placed on the base table, and the base table is moved manually to cause the substrate of the display panel to approach the heating head. The chip is heated by the heating head such that the anisotropic conductive film is heated to soften at a corresponding location. As the heating head is rotatable, when the display panel approaches the heating head, if the face of the chip on the substrate of the display panel is not parallel to the face of the heating head facing towards the chip, the portion of the chip which contacts with the heating head at first will push the heating head to rotate such that the face of the heating head facing towards the chip and the face of the chip facing towards the heating head may be contacted with each other more sufficiently. In this way, the force to which the portion of the chip contacting with the heating head firstly is subject may be reduced and the force applied to the chip may become more uniform.

In an embodiment, the rotation axis is located on a side of a perpendicular bisector of the base seat facing towards the base table, so that the chip and the heating head may be contacted with each other more sufficiently.

In an embodiment, the heating head is mounted onto the base seat by a bearing.

In an embodiment, the heating head is mounted onto the base seat by a mounting shaft.

In an embodiment, the base table is slidably connected to the loading station, so as to facilitate pushing the base table, such that the substrate on the base table may approach the heating head more conveniently.

In an embodiment, a plurality of rollers are arranged on a face of the base table facing towards the loading station and the base table is slidably connected to the loading station by the plurality of rollers.

In an embodiment, a sliding rail which extends towards the heating head is provided on the loading station and the base table is provided with a sliding block fitted to the sliding rail provided on the loading station, and the base table and the loading station are connected with each other by the sliding rail and the sliding block.

In an embodiment, a sliding block which extends towards the heating head is provided on the loading station and the base table is provided with a sliding rail fitted to the sliding block provided on the loading station, and the base table and the loading station are connected with each other by the sliding block and the sliding rail.

In an embodiment, a face of the base table which is arranged to support the display panel is provided with a plurality of vacuum adsorption holes for adsorbing the display panel, so as to facilitate fixing the substrate onto the base table better to prevent the substrate from moving when it collides with the heating head.

In an embodiment, the apparatus for removing the chip further includes a fixing plate arranged at a side of the base table away from the base seat, fixed on the loading station and fixed with respect to the base seat, wherein a spring is provided between the fixing plate and the base table and the spring has one end connected to the fixing plate and the other end connected to the base table. Provision of the spring may facilitate restoration of the base table. After the chip is removed, the substrate does not need to be moved artificially away from the heating head. That is, when the base table is located at a first position (when the chip on the substrate fails to contact with the heating head), the spring has an original length. When the base table drives the substrate to approach the heating head, the spring is in an extended state. After the chip is heated and removed, the spring retracts to move the base table back to the first position.

In an alternative embodiment, the apparatus for removing the chip further includes a fixing plate arranged on a side of the base table facing towards the base seat and fixed with respect to the base table, wherein a spring is provided between the fixing plate and the base seat and the spring has one end connected to the fixing plate and the other end connected to the base seat. Provision of the spring may facilitate restoration of the base table. After the chip is removed, the substrate does not need to be moved artificially away from the heating head. That is, when the base table is located at a first position (when the chip on the substrate fails to contact with the heating head), the spring has an original length. When the base table drives the substrate to approach the heating head, the spring is in a retracted state. After the chip is heated and removed, the spring extends to move the base table back to the first position.

Figure 1:
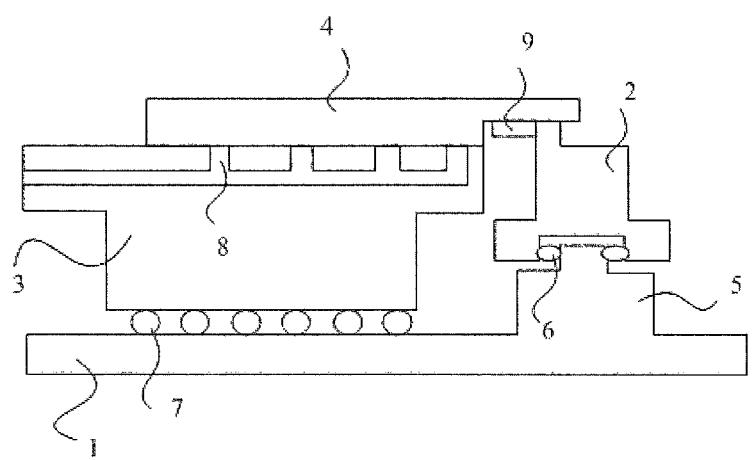
FIG. 1 is a schematic view showing a structure of an apparatus for removing a chip provided by an embodiment of the present disclosure.

| Reference Numerals: | |
| --- | --- |
| 1-loading station | 2-heating head |
| 3-base table | 4-substrate |
| 5-base seat | 6-bearing |
| 7-roller | 8-vacuum adsorption hole |
| 9-chip | 10-fixing plate |
| 11-spring | |

DETAILED DESCRIPTION OF EMBODIMENTS

Solutions of the embodiments of the present disclosure will be described clearly and completely with reference to figures of the present application. Apparently, the described embodiments are only part of embodiments of the present disclosure, instead of all of embodiments. From the embodiments of the present disclosure, all of other embodiments that the ordinary skilled person in the art obtains without paying creative efforts should fall within the scope of the present disclosure.

As illustrated in FIG. 1, it schematically shows the structure of the apparatus for removing the chip provided by an embodiment of the present disclosure. The apparatus for removing the chip includes: a loading station 1; a heating head 2 arranged to soften an anisotropic conductive film on a substrate 4 of a display panel for fixing the chip 9; a base table 3 arranged on the loading station 1 and arranged to support the display panel; and a base seat 5 arranged on the loading station 1 and arranged to support the heating head 2. The heating head 2 is rotatably mounted onto the base seat 5 and the heating head 2 has a rotation axis perpendicular to a surface of the loading station 1 facing towards the base table 3.

With the apparatus for removing the chip provided by the present disclosure, in use, the substrate 4 of the display panel is placed on the base table 3, and the base table 3 is moved manually to cause the substrate 4 of the display panel to approach the heating head 2. The chip 9 is heated by the heating head 2 such that the anisotropic conductive film is heated to soften at a corresponding location. As the heating head 2 is rotatable, when the display panel approaches the heating head 2, if the face of the chip 9 on the substrate 4 of the display panel is not parallel to the face of the heating head 2 facing towards the chip 9, the portion of the chip 9 which contacts with the heating head 2 at first will push the heating head 2 to rotate such that the face of the heating head 2 facing towards the chip 9 and the face of the chip 9 facing towards the heating head 2 may be contacted with each other more sufficiently. In this way, the force to which the portion of the chip 9 contacting with the heating head 2 firstly is subject may be reduced and the force applied to the chip 9 may become more uniform and the chance that the chip cracks to scratch electrodes of the display panel may be reduced.

The anisotropic conductive film mainly includes two parts, i.e., resin adhesives and conductive particles. The resin adhesives have main functions of fixing the relative position of electrodes between the chip and the glass substrate and providing an oppression force to maintain a contact area between the electrodes and the conductive particles besides moisture-resist, adhesive, heat-resist and insulation functions. The anisotropic conductive film is characterized that difference between the resistance characteristics of the Z axis electrical conducting direction and the XY insulation plane is significant. When the difference between the resistance value in the Z axis electrical conducting direction and the resistance value in the XY insulation plane exceeds over a certain ratio, it may be called as good conductive anisotropy. The conductive principle is that the electrodes between the chip and the display panel are connected by conductive particles and are conducted while short circuit between two adjacent electrodes is avoided to achieve electrical conduction only in the Z axis electrical conducting direction.

In an embodiment, the rotation axis is located on a side of a perpendicular bisector of the base seat 5 facing towards the base table 3, such that the chip 9 contacts with the heating head 2 more sufficiently.

The above heating head 2 may be mounted onto the base seat 5 by various means.

In an example, as shown in FIG. 1, the above heating head 2 is mounted onto the base seat 5 by a bearing 6. In this way, the heating head 2 may be mounted and detached more conveniently.

In another example, the heating head 2 is mounted onto the base seat 5 by a mounting shaft (not shown).

In order to move the base table 3 conveniently so as to allow the substrate 4 of the display panel on the base table 3 to approach the heating head 2 more easily, in a preferable embodiment, the base table 3 is slidably connected to the loading station 1.

In an embodiment, as illustrated in FIG. 1, a plurality of rollers 7 are arranged on a face of the base table 3 facing towards the loading station 1 and the base table 3 is slidably connected to the loading station 1 by the plurality of rollers 7.

In another embodiment, a sliding rail (not shown) which extends towards the heating head 2 is provided on the loading station 1 and the base table 3 is provided with a sliding block (not shown) slidably fitted to the sliding rail, and the base table 3 and the loading station 1 are connected with each other by the sliding rail and the sliding block.

In an alternative embodiment, a sliding block (not shown) which extends towards the heating head 2 is provided on the loading station 1 and the base table 3 is provided with a sliding rail (not shown) slidably fitted to the sliding block, and the base table 3 and the loading station 1 are connected with each other by the sliding block and the sliding rail.

In an embodiment, as shown in FIG. 1, a face of the base table 3 which is arranged to support the substrate 4 of the display panel is provided with a plurality of vacuum adsorption holes 8 for adsorbing the substrate 4 of the display panel to facilitate fixing the substrate 4 onto the base table 3 better, so as to prevent the substrate 4 from moving when it collides with the heating head 2.

Figure 2A:
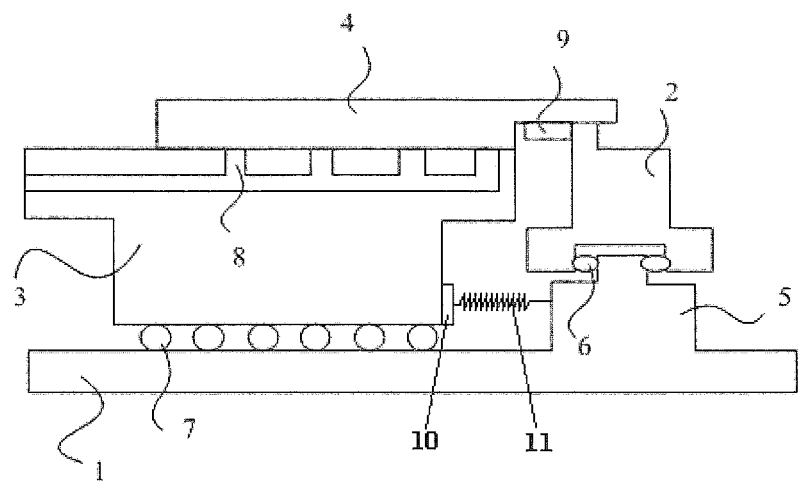
FIG. 2a is a schematic view showing a structure of an apparatus for removing a chip according to an embodiment of the present disclosure, in which the spring between the fixed plate and the base seat is compressed and the chip on the substrate contacts with the heating head.
Figure 2B:
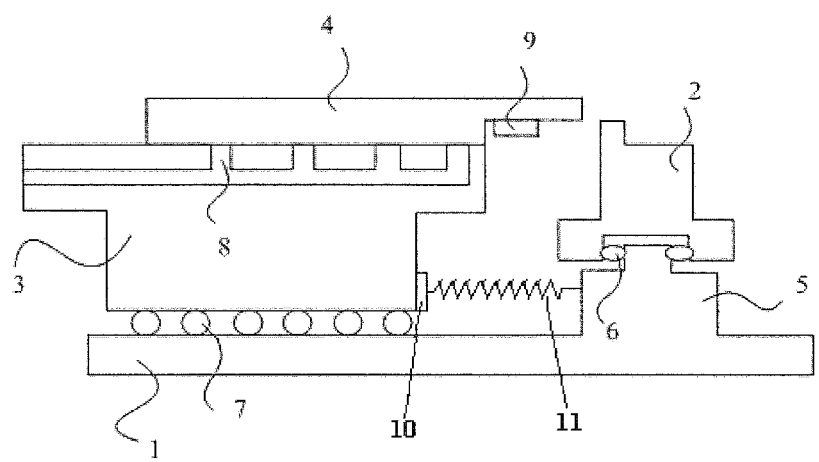
FIG. 2b is a schematic view showing a structure of an apparatus for removing a chip according to an embodiment of the present disclosure, in which the spring between the fixed plate and the base seat is in natural state and the chip on the substrate does not contact with the heating head.

As an example, for example, as shown in FIGS. 2a and 2b, the above apparatus for removing the chip further includes a fixing plate 10 arranged on a side of the base table 3 facing towards the base seat 5 and fixed with respect to the base table 3, wherein a spring 11 is provided between the fixing plate 10 and the base seat 5 and the spring 11 has one end connected to the fixing plate 10 and the other end connected to the base seat 5. Provision of the spring may facilitate restoration of the base table 3. After the chip 9 is removed, the substrate 4 does not need to be moved artificially away from the heating head 2. That is, when the base table 3 is located at a first position (when the chip 9 on the substrate 4 fails to contact with the heating head 2), the spring has an original length, as illustrated in FIG. 2b. When the base table 3 drives the substrate 4 to approach the heating head 2, the spring is in a retracted state, as illustrated in FIG. 2a. After the chip 9 is heated and removed, the spring extends to move the base table 3 back to the first position.

Alternatively, the fixing plate 10 may be arranged at a side of the base table 3 away from the base seat 5, fixed on the loading station 1 and fixed with respect to the base seat 5. A spring is provided between the fixing plate 10 and the base table 3 and the spring has one end connected to the fixing plate 10 and the other end connected to the base table 3. After the chip 9 is removed, the substrate 4 does not need to be moved artificially away from the heating head 2. That is, when the base table 3 is located at a first position (when the chip 9 on the substrate 4 fails to contact with the heating head 2), the spring has an original length. When the base table 3 drives the substrate 4 to approach the heating head 2, the spring is in an extended state. After the chip 9 is heated and removed, the spring retracts to move the base table 3 back to the first position.

It would be appreciated by those skilled in the art that various modifications and variations of the above embodiments may be made without departing from the scope and spirit of the disclosure. Thus, these modifications and variations should be contained the present disclosure if they fall within the scope defined by the appended claims and equivalents thereof.

What is claimed is:

1. An apparatus for removing a chip, comprising:
a loading station;
a heating head arranged to soften an anisotropic conductive film on a substrate of a display panel for fixing the chip;
a base table arranged on the loading station and arranged to support the display panel; and
a base seat arranged on the loading station and arranged to support the heating head,
wherein the heating head is rotatably mounted onto the base seat and the heating head has a rotation axis perpendicular to a face of the loading station facing towards the base table,
wherein the base table is slidably connected to the loading station.

2. The apparatus according to claim 1, wherein the rotation axis is located on a side of a perpendicular bisector of the base seat facing towards the base table.

3. The apparatus according to claim 1, wherein the heating head is mounted onto the base seat by a bearing.

4. The apparatus according to claim 1, wherein the heating head is mounted onto the base seat by a mounting shaft.

5. The apparatus according to claim 1, wherein a plurality of rollers are arranged on a face of the base table facing towards the loading station and the base table is slidably connected to the loading station by the plurality of rollers.

6. The apparatus according to claim 5, wherein a face of the base table which is arranged to support the display panel is provided with a plurality of vacuum adsorption holes for adsorbing the substrate of the display panel.

7. The apparatus according to claim 5, further comprising: a fixing plate arranged at a side of the base table away from the base seat, fixed on the loading station and fixed with respect to the base seat, wherein a spring is provided between the fixing plate and the base table and the spring has one end connected to the fixing plate and the other end connected to the base table.

8. The apparatus according to claim 5, further comprising: a fixing plate arranged on a side of the base table facing towards the base seat and fixed with respect to the base table, wherein a spring is provided between the fixing plate and the base seat and the spring has one end connected to the fixing plate and the other end connected to the base seat.

9. The apparatus according to claim 1, wherein a sliding rail which extends towards the heating head is provided on the loading station and the base table is provided with a sliding block fitted to the sliding rail provided on the loading station, and the base table and the loading station are connected with each other by the sliding rail and the sliding block; or
wherein a sliding block which extends towards the heating head is provided on the loading station and the base table is provided with a sliding rail fitted to the sliding block provided on the loading station, and the base table and the loading station are connected with each other by the sliding rail and the sliding block.

10. The apparatus according to claim 1, wherein a face of the base table which is arranged to support the display panel is provided with a plurality of vacuum adsorption holes for adsorbing the substrate of the display panel.

* * * * *